(12) United States Patent
Terakami et al.

(10) Patent No.: US 9,305,903 B2
(45) Date of Patent: Apr. 5, 2016

(54) LIGHT-EMITTING DEVICE AND METHOD OF MANUFACTURING THE SAME

(71) Applicant: TOYODA GOSEI CO., LTD., Kiyosu-shi (JP)

(72) Inventors: Mitsushi Terakami, Kiyosu (JP); Takayoshi Yajima, Kiyosu (JP); Hiroshi Ito, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/332,262

(22) Filed: Jul. 15, 2014

(65) Prior Publication Data

US 2015/0076534 A1    Mar. 19, 2015

(30) Foreign Application Priority Data

Sep. 17, 2013  (JP) ................................ 2013-191636
Mar. 18, 2014  (JP) ................................ 2014-055244

(51) Int. Cl.
*H01L 25/075*  (2006.01)
*H01L 33/50*  (2010.01)

(52) U.S. Cl.
CPC .......... *H01L 25/0753* (2013.01); *H01L 33/504* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 2002/0185965 A1* | 12/2002 | Collins et al. ................ | 313/501 |
| 2006/0038477 A1 | 2/2006 | Tamaki et al. | |
| 2007/0170454 A1* | 7/2007 | Andrews ....................... | 257/100 |
| 2008/0137331 A1* | 6/2008 | Kaneko et al. ............... | 362/231 |
| 2010/0207134 A1 | 8/2010 | Tanaka et al. | |
| 2011/0278605 A1 | 11/2011 | Agatani et al. | |
| 2012/0008318 A1 | 1/2012 | Ishiwata et al. | |

FOREIGN PATENT DOCUMENTS

| | | |
|---|---|---|
| JP | 2004-071726 A | 3/2004 |
| JP | 2009-224074 A | 10/2009 |
| JP | 2011-204659 A | 10/2011 |
| JP | 2012-004519 A | 1/2012 |

* cited by examiner

*Primary Examiner* — Fernando L Toledo
*Assistant Examiner* — Lawrence-Linh T Nguyen
(74) *Attorney, Agent, or Firm* — McGinn IP Law Group PLLC

(57) ABSTRACT

A light-emitting device includes a first light-emitting element disposed on a substrate, a convex-shaped first sealing resin that includes an annular portion formed in a closed annular shape in a top view and seals the first light-emitting element, a second light-emitting element disposed on the substrate in a region surrounded by the annular portion of the first sealing resin, and a second sealing resin filled in the region surrounded by the annular portion so as to seal the second light-emitting element. One of the first and second sealing resin includes a phosphor particle or the first and second sealing resins include a phosphor particle to emit a different fluorescent color from each other.

12 Claims, 8 Drawing Sheets

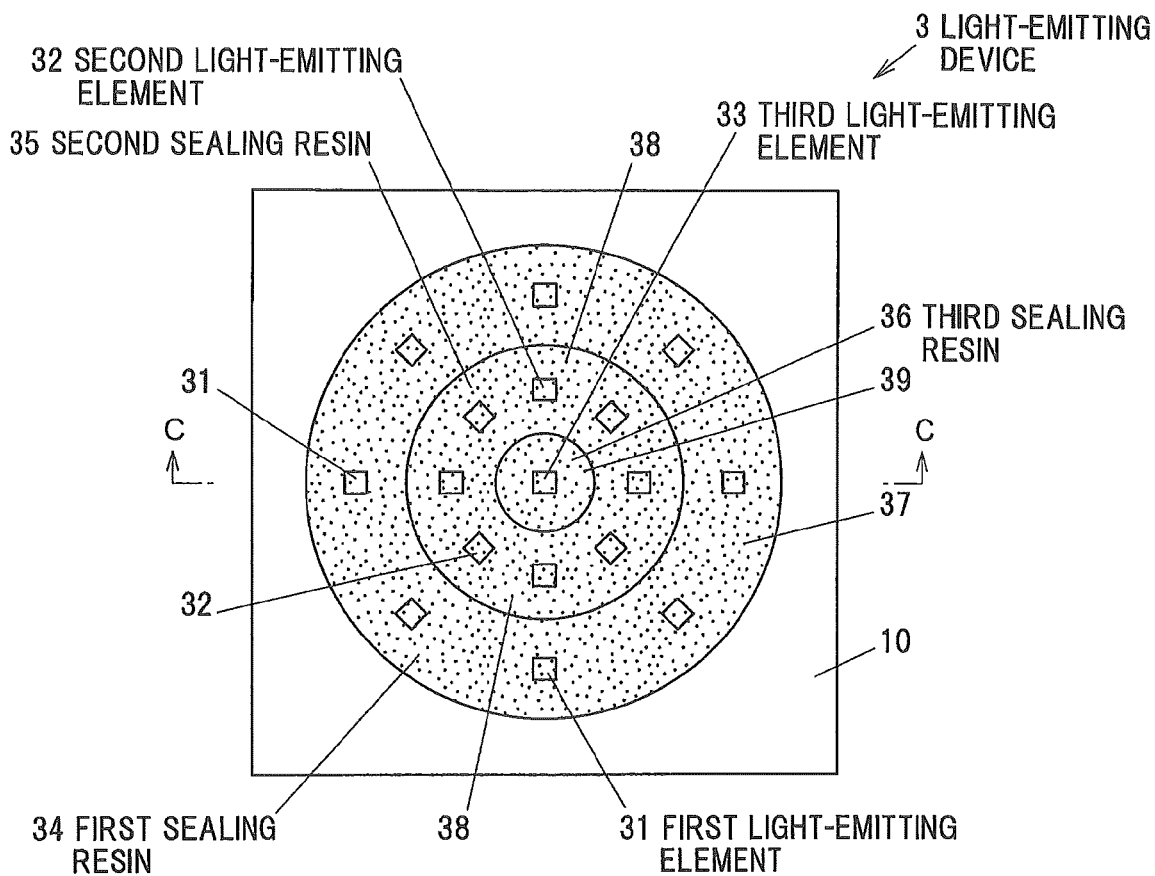
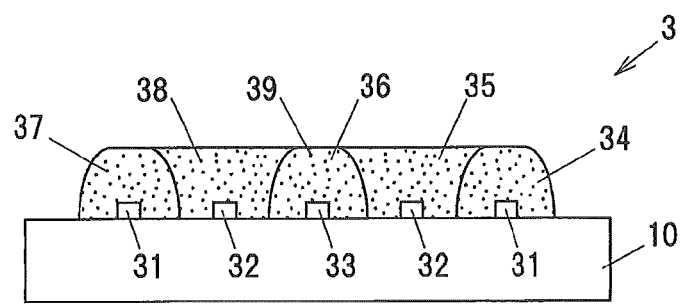

LIGHT-EMITTING DEVICE AND METHOD OF MANUFACTURING THE SAME

The present application is based on Japanese patent application Nos. 2013-191636 and 2014-055244 filed on Sep. 17, 2013 and Mar. 18, 2014, respectively, the entire contents of which are incorporated herein by reference.

BACKGROUND OF THE INVENTION

1. Field of the Invention

The invention relates to a light-emitting device and a method of manufacturing the light-emitting device.

2. Description of the Related Art

Light-emitting devices and lighting systems having plural light-emitting portions to emit different colors are known (see e.g. JP-A-2004-071726, JP-A-2009-224074, JP-A-2011-204659 and JP-A-2012-004519).

JP-A-2004-071726 discloses a light-emitting device that a stepped portion is provided in a package and LED chips are placed on upper and lower steps. A resin for sealing the LED chips on the upper step and a resin for sealing the LED chips on the lower step include phosphors respectively emitting different fluorescent colors.

JP-A-2009-224074 discloses a light-emitting device that a blue LED chip covered with a resin including red phosphor, a blue LED chip covered with a resin including green phosphor and a blue LED chip covered with a resin including blue phosphor are provided on a substrate and these resins including different phosphors are formed away from each other.

JP-A-2011-204659 discloses a lighting system that a red LED chip, a green LED chip, a blue LED chip and a blue LED chip covered with a resin including yellow phosphor are provided on a substrate.

JP-A-2012-004519 discloses a light-emitting device that has a resin frame provided on a substrate, a resin partition wall for dividing a portion surrounded by the resin frame into two zones, a blue LED chip placed in one zone and sealed with a resin including red phosphor and a blue LED chip placed in another zone and sealed with a resin including yellow phosphor. Since the two zones are separate from each other by the resin partition wall, the resin including red phosphor and the resin including yellow phosphor can be prevented from mixing with each other upon filling the resins. The resin frame and the resin partition wall are formed of a resin with a light reflecting or shielding property.

SUMMARY OF THE INVENTION

It is an object of the invention to provide a light-emitting device that has plural light-emitting portions to emit different colors and is suited to simplification of a manufacturing process thereof and reduction in occupied area, as well as a method of manufacturing the light-emitting device.

(1) According to one embodiment of the invention, a light-emitting device comprises:

a first light-emitting element disposed on a substrate;

a convex-shaped first sealing resin that comprises an annular portion formed in a closed annular shape in a top view and seals the first light-emitting element;

a second light-emitting element disposed on the substrate in a region surrounded by the annular portion of the first sealing resin; and a second sealing resin filled in the region surrounded by the annular portion so as to seal the second light-emitting element, wherein one of the first and second sealing resin includes a phosphor particle or the first and second sealing resins include a phosphor particle to emit a different fluorescent color from each other.

In the above embodiment (1) of the invention, the following modifications and changes can be made.

(i) A resin material of the first sealing resin has a higher thixotropy before curing than a resin material of the second sealing resin.

(ii) The substrate comprises a concave portion and a convex portion on an upper surface thereof, wherein the first light-emitting element is disposed on a bottom surface of the concave portion, wherein the first sealing resin is provided in the concave portion and above the concave portion, and wherein the second light-emitting element is disposed on an upper surface of the convex portion.

(iii) An emission wavelength of the first light-emitting element is longer than that of the second light-emitting element.

(2) According to another embodiment of the invention, a method of manufacturing a light-emitting device comprises:

placing first and second light-emitting elements on a substrate;

forming a convex-shaped first sealing resin comprising an annular portion formed in a closed annular shape in a top view by stacking up a first resin on the substrate so that the first light-emitting element is sealed and the second light-emitting element is surrounded by the annular portion; and forming a second sealing resin for sealing the second light-emitting element by filling a region surrounded by the annular portion with a second resin by using the annular portion as a dam, wherein one of the first and second sealing resin includes a phosphor particle or the first and second sealing resins include a phosphor particle to emit a different fluorescent color from each other.

In the above embodiment (2) of the invention, the following modifications and changes can be made.

(iv) The first resin has a higher thixotropy than the second resin.

(v) The substrate comprises a concave portion and a convex portion on an upper surface thereof, wherein the first light-emitting element is disposed on a bottom surface of the concave portion, wherein the second light-emitting element is disposed on an upper surface of the convex portion, and wherein the first resin is filled in the concave portion and is further stacked up above the concave portion so as to form the first sealing resin.

(vi) An emission wavelength of the first light-emitting element is longer than that of the second light-emitting element.

Effects of the Invention

According to one embodiment of the invention, a light-emitting device can be provided that has plural light-emitting portions to emit different colors and is suited to simplification of a manufacturing process thereof and reduction in occupied area, as well as a method of manufacturing the light-emitting device.

BRIEF DESCRIPTION OF THE DRAWINGS

Next, the present invention will be explained in more detail in conjunction with appended drawings, wherein:

FIG. 4A is a top view showing a light-emitting device in a third embodiment;

FIG. 4B is a vertical cross-sectional view showing the light-emitting device taken on line C-C of FIG. 4A;

DETAILED DESCRIPTION OF THE PREFERRED EMBODIMENTS

First Embodiment
Structure of Light-Emitting Device

Figure 1A:
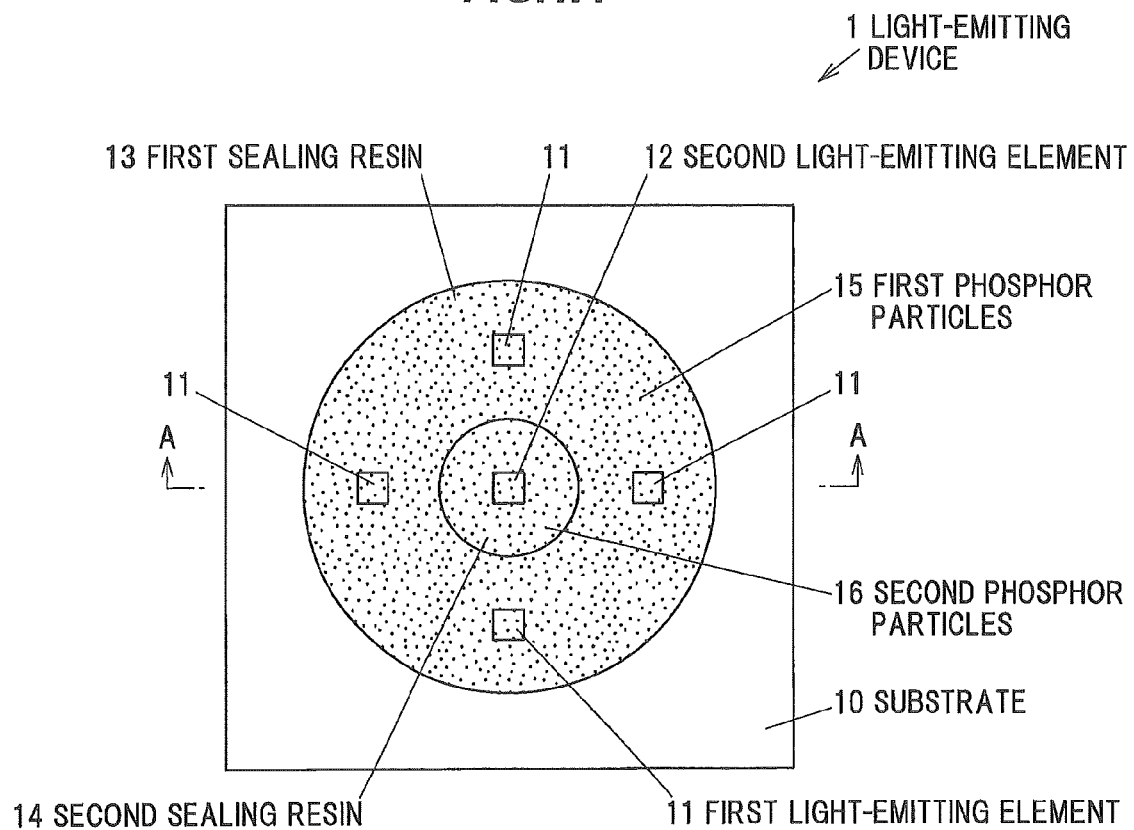
FIG. 1A is a top view showing a light-emitting device in a first embodiment.
Figure 1B:
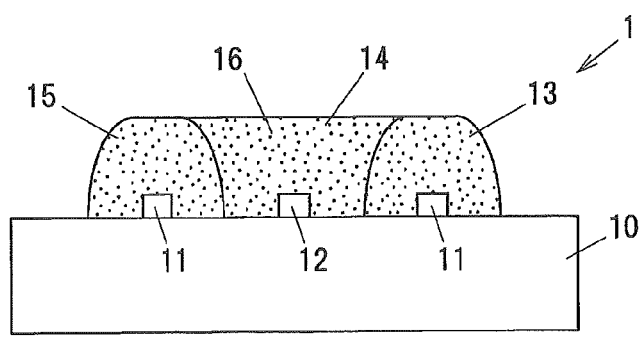
FIG. 1B is a vertical cross-sectional view showing the light-emitting device taken on line A-A of FIG. 1A.

FIG. 1A is a top view showing a light-emitting device 1 in the first embodiment. FIG. 1B is a vertical cross-sectional view showing the light-emitting device 1 taken on line A-A of FIG. 1A.

The light-emitting device 1 has a substrate 10, first light-emitting elements 11 placed on the substrate 10, a convex-shaped first sealing resin 13 which has a closed annular shape in a top view and seals the first light-emitting elements 11, a second light-emitting element 12 arranged on the substrate 10 in a region surrounded by the first sealing resin 13, and a second sealing resin 14 filled in the region surrounded by the first sealing resin 13 to seal the second light-emitting element 12.

Either the first sealing resin 13 or the second sealing resin 14 includes phosphor particles, or the first sealing resin 13 and the second sealing resin 14 respectively include phosphor particles emitting different fluorescent colors. In the example shown in FIGS. 1A and 1B, the first sealing resin 13 and the second sealing resin 14 respectively include first phosphor particles 15 and second phosphor particles 16.

The substrate 10 is, e.g., a circuit board or a lead frame inserted board.

The first light-emitting element 11 and the second light-emitting element 12 are, e.g., an LED chip having a chip substrate and a crystal layer which includes cladding layers and a light-emitting layer sandwiched therebetween. The first light-emitting element 11 and the second light-emitting element 12 may be a face-up LED chip with the crystal layer facing upward or a face-down LED chip with the crystal layer facing downward. Alternatively, light-emitting elements other than LED chips, such as laser diode, may be used.

The first light-emitting elements 11 and the second light-emitting element 12 are connected to a non-illustrated conductive member such as a wiring pattern or a lead frame included in the substrate 10 and power is supplied separately to the first light-emitting element 11 and the second light-emitting element 12 through the conductive member.

The first sealing resin 13 and the second sealing resin 14 is formed of a transparent resin, e.g., a silicone-based resin or an epoxy-based resin, etc.

Since the first sealing resin 13 is formed by stacking up a resin on the substrate 10, thixotropy of the resin before curing is preferably high. When thixotropy is high, an increase in viscosity after formation is large and the shape thereof is thus likely to be kept until the resin is cured.

On the other hand, the second sealing resin 14 is formed by filling a region surrounded by the first sealing resin 13 with a resin using the first sealing resin 13 as a dam and then curing the resin. Accordingly, if the resin has high thixotropy before curing, it is difficult to appropriately fill the resin.

Therefore, the resin as a material of the first sealing resin 13 preferably has higher thixotropy before curing than the resin as a material of the second sealing resin 14.

Since the second sealing resin 14 is formed after the first sealing resin 13 is completely or substantially cured, the first sealing resin 13 and the second sealing resin 14 are not mixed with each other. In other words, phosphor particles included in each of the first sealing resin 13 and the second sealing resin 14 do not move into the other sealing resin.

The following Table 1 shows examples of combinations of emission color of light-emitting element and fluorescent color of phosphor particles (combinations of emission color of the first light-emitting element 11 and fluorescent color of the first phosphor particles 15, or combinations of emission color of the second light-emitting element 12 and fluorescent color of the second phosphor particles 16). Note that, "nil" in Table means that phosphor particles (the first phosphor particles 15 or the second phosphor particles 16) are not used. In addition, "blue+green+red", "blue+green+yellow+red", "blue+yellow+red", "blue+yellow", "green+red" and "yellow+red" mean that plural types of phosphor particles each emitting different color are used in combination.

TABLE 1

| | Light-emitting element | Phosphor particles |
|---|---|---|
| 1 | Violet | not included |
| 2 | Blue | not included |
| 3 | Green | not included |
| 4 | Red | not included |
| 5 | Violet | Blue |
| 6 | Violet | Green |
| 7 | Violet | Red |
| 8 | Violet | Yellow |
| 9 | Blue | Green |
| 10 | Blue | Red |
| 11 | Blue | Yellow |
| 12 | Violet | Blue + Green + Red |
| 13 | Violet | Blue + Green + Yellow + Red |
| 14 | Violet | Blue + Yellow + Red |
| 15 | Violet | Blue + Yellow |
| 16 | Blue | Green + Red |
| 17 | Blue | Yellow + Red |
| 18 | Green | Red |
| 19 | Green | Yellow |

Appropriate selection of the combination of the first light-emitting element 11 and the first phosphor particles 15 and the combination of the second light-emitting element 12 and the second phosphor particles 16 allows emission color of a light-emitting portion composed of the first light-emitting element 11 and the first sealing resin 13 including the first phosphor particles 15 and emission color of a light-emitting portion composed of the second light-emitting element 12 and the second sealing resin 14 including the second phosphor particles 16 to be arbitrarily set, and it is thereby possible to obtain the light-emitting device 1 which emits light of desired color.

For example, there are phosphors with high blue-light excitation efficiency and those with high violet-light excitation efficiency. It is possible to appropriately select the first phosphor particles 15 depending on excitation characteristics of these phosphors. When some of light-emitting elements included in the light-emitting device 1 emit violet light, violet color is added to emission light of the light-emitting device 1 and color rendering properties of the light-emitting device 1 are thereby improved.

In addition, since power is supplied separately to the first light-emitting element 11 and the second light-emitting element 12, it is possible to arbitrarily control light intensity of each light-emitting element. This allows emission chromaticity or color rendering properties to be finely adjusted. In addition, it is possible to cause only one of the first light-emitting element 11 and the second light-emitting element 12 to emit light.

Manufacturing Process of Light-Emitting Device

An example of a manufacturing process of the light-emitting device 1 will be described below.

Figure 2A:
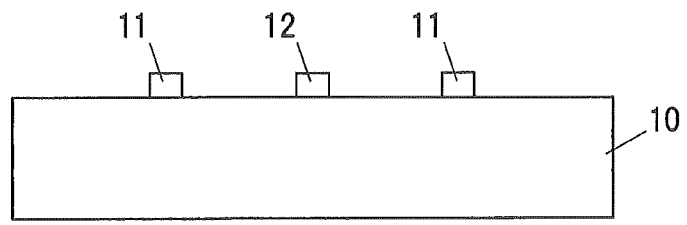
FIGS. 2A to 2C are vertical cross-sectional views showing a manufacturing process of the light-emitting device in the first embodiment.
Figure 2B:
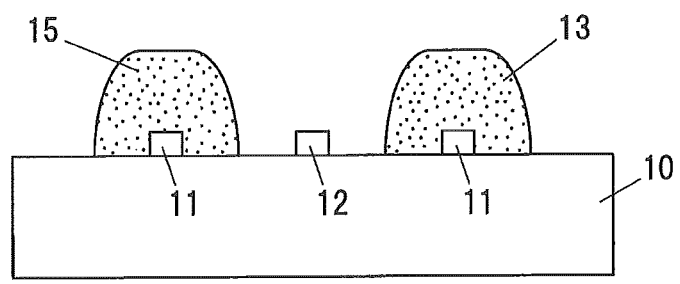
Figure 2C:
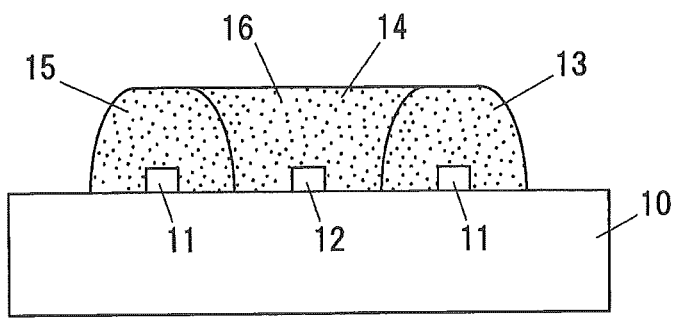

FIGS. 2A to 2C are vertical cross-sectional views showing a manufacturing process of the light-emitting device 1 in the first embodiment.

Firstly, as shown in FIG. 2A, the first light-emitting elements 11 and the second light-emitting element 12 are placed on the substrate 10.

Next, as shown in FIG. 2B, a resin including the first phosphor particles 15 is stacked up on the substrate 10 so as to seal the first light-emitting elements 11 and to surround the second light-emitting element 12, thereby forming the first sealing resin 13.

In detail, for example, a liquid resin including the first phosphor particles 15 is stacked up on the substrate 10 by dripping, etc., and is then cured, thereby forming the first sealing resin 13. Here, by using a highly thixotropic resin as the resin of the first sealing resin 13, it is possible to suppress deformation of the first sealing resin 13 before curing.

Next, as shown in FIG. 2C, a resin including the second phosphor particles 16 is filled in a region surrounded by the first sealing resin 13 using the first sealing resin 13 as a dam and is then cured, thereby forming the second sealing resin 14 which seals the second light-emitting element 12. Here, the resin of the second sealing resin 14 is filled after the first sealing resin 13 is cured to the extent that the first sealing resin 13 is not mixed with the resin of the second sealing resin 14.

Second Embodiment

The second embodiment is different from the first embodiment in that the light-emitting device is provided with a reflector. It should be noted that the explanation of the same features as the first embodiment will be omitted or simplified.

Structure of Light-Emitting Device

Figure 3A:
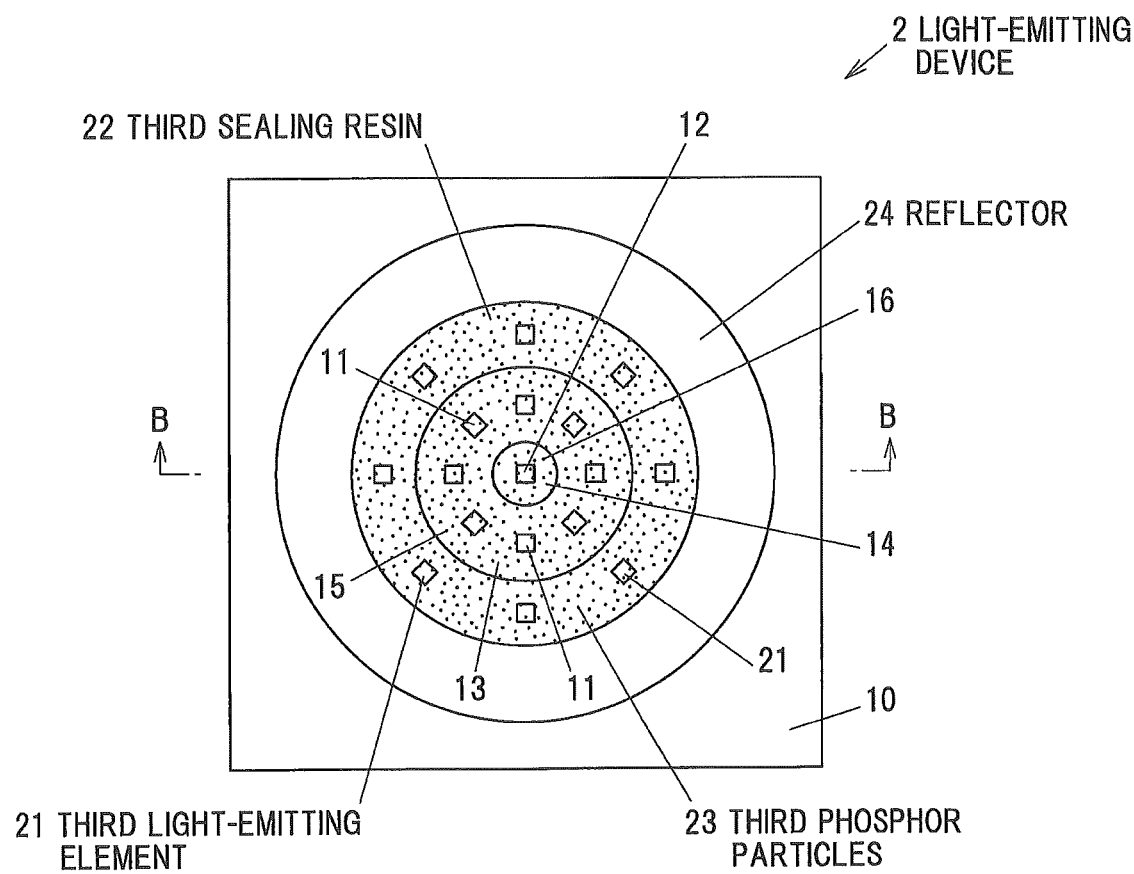
FIG. 3A is a top view showing a light-emitting device in a second embodiment.
Figure 3B:
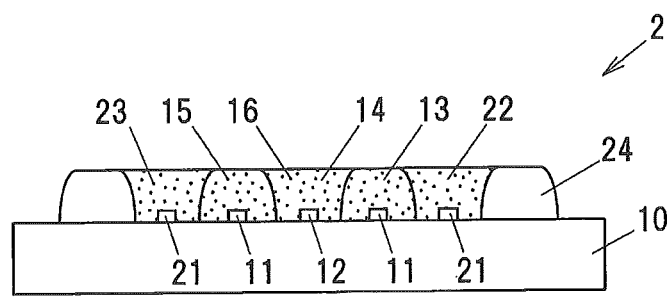
FIG. 3B is a vertical cross-sectional view showing the light-emitting device taken on line B-B of FIG. 3A.

FIG. 3A is a top view showing a light-emitting device 2 in the second embodiment. FIG. 3B is a vertical cross-sectional view showing the light-emitting device 2 taken on line B-B of FIG. 3A.

In the same manner as the light-emitting device 1 in the first embodiment, the light-emitting device 2 has the substrate 10, the first light-emitting elements 11 placed on the substrate 10, the convex-shaped first sealing resin 13 which has a closed annular shape in a plan view and seals the first light-emitting elements 11, the second light-emitting element 12 arranged on the substrate 10 in a region surrounded by the first sealing resin 13, and the second sealing resin 14 filled in the region surrounded by the first sealing resin 13 to seal the second light-emitting element 12.

The light-emitting device 2 further includes a reflector 24 having a closed annular shape in a top view and surrounding the first sealing resin 13, third light-emitting elements 21 placed on the substrate 10 in a region between the first sealing resin 13 and the reflector 24, and a third sealing resin 22 filled in the region between the first sealing resin 13 and the reflector 24 to seal the third light-emitting elements 21.

Either the first sealing resin 13 or the second sealing resin 14 includes phosphor particles, or the first sealing resin 13 and the second sealing resin 14 respectively include phosphor particles emitting different fluorescent colors. In addition, either the first sealing resin 13 or the third sealing resin 22 includes phosphor particles, or the first sealing resin 13 and the third sealing resin 22 respectively include phosphor particles emitting different fluorescent colors. In the example shown in FIGS. 3A and 3B, the first sealing resin 13, the second sealing resin 14 and the third sealing resin 22 respectively include the first phosphor particles 15, the second phosphor particles 16 and third phosphor particles 23.

The third light-emitting element 21 is the same light-emitting element as the first light-emitting element 11 and the second light-emitting element 12.

The first light-emitting elements 11, the second light-emitting element 12 and the third light-emitting elements 21 are connected to a non-illustrated conductive member such as a wiring pattern or a lead frame included in the substrate 10 and power is supplied separately to the first light-emitting elements 11, the second light-emitting element 12 and the third light-emitting elements 21 through the conductive member.

The reflector 24 is formed of, e.g., a thermoplastic resin such as polyphthalamide resin, LCP (Liquid Crystal Polymer) or PCT (Polycyclohexylene Dimethylene Terephalate) or a thermosetting resin such as silicone resin, modified silicone resin, epoxy resin or modified epoxy resin. The reflector 24 may include light-reflecting particles of titanium dioxide, etc., to improve light reflectance.

The third sealing resin 22 is formed by filling the region between the first sealing resin 13 and the reflector 24 with a resin using the first sealing resin 13 and the reflector 24 as dams and then curing the resin. Accordingly, if the resin has high thixotropy before curing, it is difficult to appropriately fill the resin.

Therefore, the resin as a material of the third sealing resin 22 preferably has lower thixotropy before curing than the resin as a material of the first sealing resin 13. The resin as a material of the third sealing resin 22 may be the same as that of the second sealing resin 14.

Since the second sealing resin 14 and the third sealing resin 22 are formed after the first sealing resin 13 is completely or substantially cured, the first sealing resin 13, the second sealing resin 14 and the third sealing resin 22 are not mixed with each other. In other words, phosphor particles included in each of the first sealing resin 13, the second sealing resin 14 and the third sealing resin 22 do not move into the other sealing resins.

Third Embodiment

The third embodiment is different from the first embodiment in that the third sealing resin is formed on the inner side of the second sealing resin. It should be noted that the explanation of the same features as the first embodiment will be omitted or simplified.

Structure of Light-Emitting Device

FIG. 4A is a top view showing a light-emitting device 3 in the third embodiment. FIG. 4B is a vertical cross-sectional view showing the light-emitting device 3 taken on line C-C of FIG. 4A.

The light-emitting device 3 has the substrate 10, first light-emitting elements 31 placed on the substrate 10, a convex-shaped first sealing resin 34 which has a closed annular shape in a top view and seals the first light-emitting elements 31, a third light-emitting element 33 arranged on the substrate 10 in a region surrounded by the first sealing resin 34, a convex-shaped third sealing resin 36 for sealing the light-emitting element 33, second light-emitting elements 32 placed on the substrate 10 in a region between the first sealing resin 34 and the third sealing resin 36, and a second sealing resin 35 filled in the region between the first sealing resin 34 and the third sealing resin 36 to seal the second light-emitting elements 32.

Either the first sealing resin 34 or the second sealing resin 35 includes phosphor particles, or the first sealing resin 34 and the second sealing resin 35 respectively include phosphor particles emitting different fluorescent colors. In addition, either the first sealing resin 34 or the third sealing resin 36 includes phosphor particles, or the first sealing resin 34 and the third sealing resin 36 respectively include phosphor particles emitting different fluorescent colors. In the example shown in FIGS. 4A and 4B, the first sealing resin 34, the second sealing resin 35 and the third sealing resin 36 respectively include first phosphor particles 37, second phosphor particles 38 and third phosphor particles 39.

The third light-emitting element 33 is the same light-emitting element as the first light-emitting element 31 and the second light-emitting element 32.

The first light-emitting elements 31, the second light-emitting elements 32 and the third light-emitting element 33 are connected to a non-illustrated conductive member such as a wiring pattern or a lead frame included in the substrate 10 and power is supplied separately to the first light-emitting elements 31, the second light-emitting elements 32 and the third light-emitting element 33 through the conductive member.

Since the first sealing resin 34 and the third sealing resin 36 are formed by stacking up a resin on the substrate 10, thixotropy of the resin before curing is preferably high. When thixotropy is high, an increase in viscosity after formation is large and the shape thereof is thus likely to be kept until the resin is cured.

The second sealing resin 35 is formed by filling a region between the first sealing resin 34 and the third sealing resin 36 with a resin using the first sealing resin 34 and the third sealing resin 36 as dams and then curing the resin. Accordingly, if the resin has high thixotropy before curing, it is difficult to appropriately fill the resin.

Therefore, the resins as materials of the first sealing resin 34 and the third sealing resin 36 preferably have higher thixotropy before curing than the resin as a material of the second sealing resin 35. Note that, the resin as a material of the third sealing resin 36 may be the same as that of the first sealing resin 34.

Since the second sealing resin 35 is formed after the first sealing resin 34 and the third sealing resin 36 are completely or substantially cured, the first sealing resin 34, the second sealing resin 35 and the third sealing resin 36 are not mixed with each other. In other words, phosphor particles included in each of the first sealing resin 34, the second sealing resin 35 and the third sealing resin 36 do not move into the other sealing resins.

Fourth Embodiment

The fourth embodiment is different from the first embodiment in that concave and convex portions on the substrate are used to arrange the light-emitting elements and the sealing resins. It should be noted that the explanation of the same features as the first embodiment will be omitted or simplified.

Structure of Light-Emitting Device

Figure 5A:
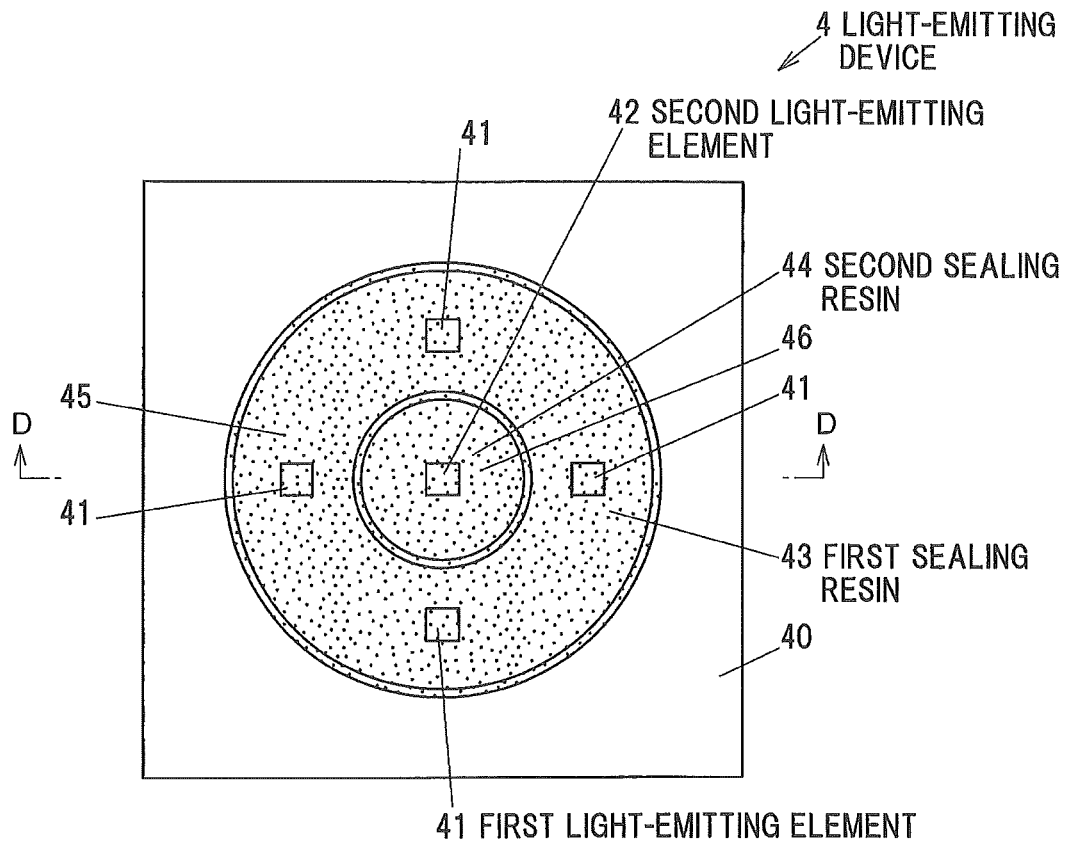
FIG. 5A is a top view showing a light-emitting device in a fourth embodiment.
Figure 5B:
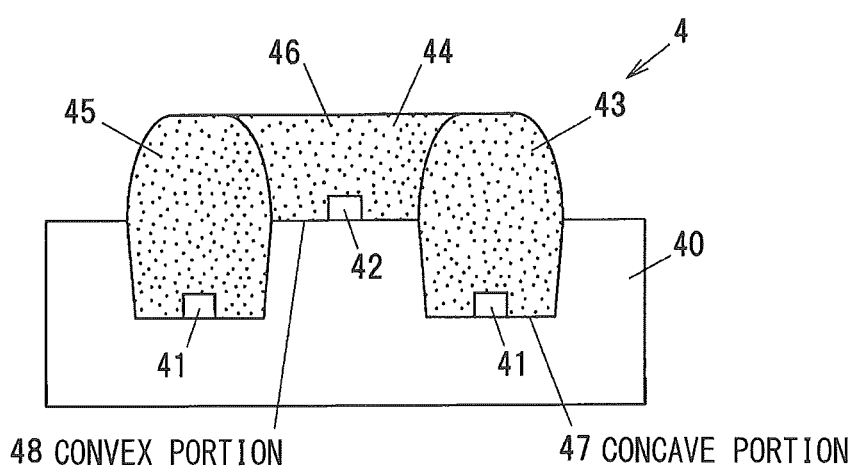
FIG. 5B is a vertical cross-sectional view showing the light-emitting device taken on line D-D of FIG. 5A.

FIG. 5A is a top view showing a light-emitting device 4 in the fourth embodiment. FIG. 5B is a vertical cross-sectional view showing the light-emitting device 4 taken on line D-D of FIG. 5A.

The light-emitting device 4 has a substrate 40 having a concave portion 47 and a convex portion 48 on the upper surface thereof, first light-emitting elements 41 placed on the bottom surface of the concave portion 47, a convex-shaped first sealing resin 43 which has a closed annular shape in a top view and is provided in the concave portion 47 as well as above the concave portion 47 to seal the first light-emitting elements 41, a second light-emitting element 42 arranged on the upper surface of the convex portion 48 which is surrounded by the first sealing resin 43, and a second sealing resin 44 filled in a region surrounded by the first sealing resin 43 to seal the second light-emitting element 42.

Either the first sealing resin 43 or the second sealing resin 44 includes phosphor particles, or the first sealing resin 43 and the second sealing resin 44 respectively include phosphor particles emitting different fluorescent colors. In the example shown in FIGS. 5A and 5B, the first sealing resin 43 and the second sealing resin 44 respectively include first phosphor particles 45 and second phosphor particles 46.

The substrate 40 is, e.g., a circuit board or a lead frame inserted board.

The first light-emitting element 41 and the second light-emitting element 42 are the same light-emitting elements as the first light-emitting element 11 and the second light-emitting element 12 in the first embodiment.

Since the first light-emitting elements 41 and the second light-emitting element 42 are placed at different heights, light absorption between light-emitting elements is less likely to occur as compared to the first embodiment in which the first light-emitting elements 11 and the second light-emitting element 12 are placed at the same height.

Since the first light-emitting elements 41 are placed at the lower position than the second light-emitting element 42, the amount of light emitted from the first light-emitting elements 41 toward the second light-emitting element 42 is larger than the amount of light emitted from the second light-emitting element 42 toward the first light-emitting elements 41. Therefore, an emission wavelength of the first light-emitting element 41 is preferably longer than that of the second light-emitting element 42 in order to suppress absorption of light from the first light-emitting elements 41 by the second light-emitting element 42. For example, when the second light-emitting element 42 is a blue LED chip, a green LED chip is used as the first light-emitting element 41.

The first sealing resin 43 and the second sealing resin 44 are respectively formed of the same resins as the first sealing resin 13 and the second sealing resin 14 in the first embodiment.

Since the first sealing resin 43 is formed by stacking a resin above the concave portion 47, thixotropy of the resin before curing is preferably high. When thixotropy is high, an increase in viscosity after formation is large and the shape thereof is thus likely to be kept until the resin is cured.

On the other hand, the second sealing resin 44 is formed by filling a region surrounded by the first sealing resin 43 with a resin using the first sealing resin 43 as a dam and then curing the resin. Accordingly, if the resin has high thixotropy before curing, it is difficult to appropriately fill the resin.

Therefore, the resin as a material of the first sealing resin 43 preferably has higher thixotropy before curing than the resin as a material of the second sealing resin 44.

Since the second sealing resin 44 is formed after the first sealing resin 43 is completely or substantially cured, the first sealing resin 43 and the second sealing resin 44 are not mixed with each other. In other words, phosphor particles included in each of the first sealing resin 43 and the second sealing resin 44 do not move into the other sealing resin.

Since the first sealing resin 43 is formed by filling the concave portion 47, it is easy to control the shape as compared to the first sealing resin 13 in the first embodiment which is formed on the flat surface.

Manufacturing Process of Light-Emitting Device

An example of a manufacturing process of the light-emitting device 4 will be described below.

Figure 6A:
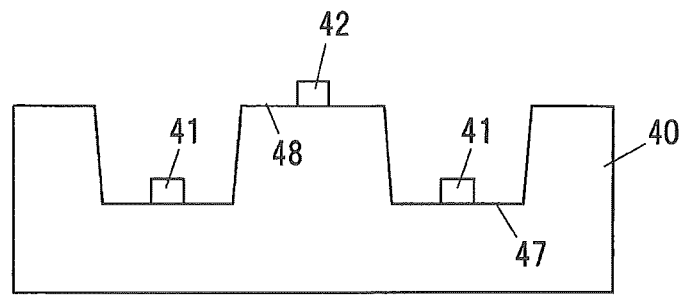
FIGS. 6A to 6C are vertical cross-sectional views showing a manufacturing process of the light-emitting device in the fourth embodiment.
Figure 6B:
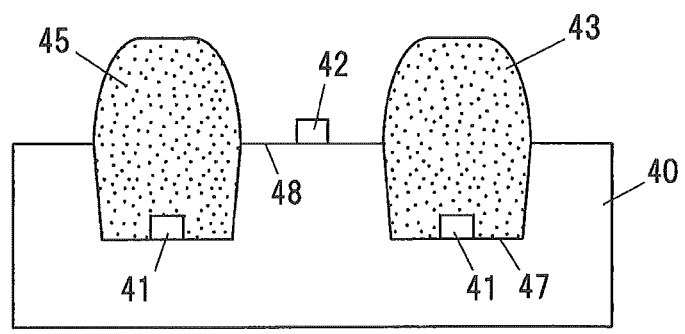
Figure 6C:
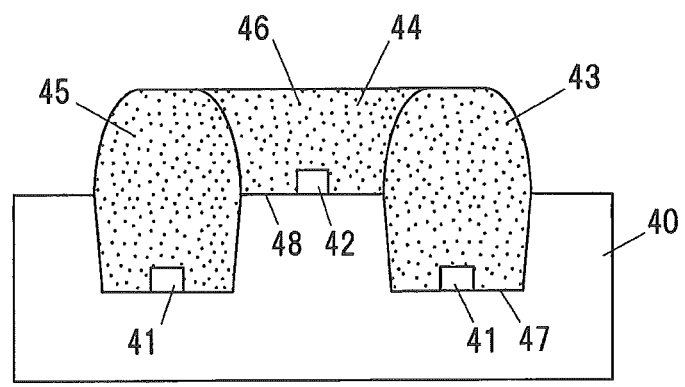

FIGS. 6A to 6C are vertical cross-sectional views showing a manufacturing process of the light-emitting device 4 in the fourth embodiment.

Firstly, as shown in FIG. 6A, the substrate 40 having the concave portion 47 and the convex portion 48 on the upper surface thereof is prepared and the first light-emitting elements 41 and the second light-emitting element 42 are placed respectively on the bottom surface of the concave portion 47 and the upper surface of the convex portion 48.

To form the substrate 40, for example, the concave portion 47 may be formed by scraping the upper surface of a plate-like substrate or the convex portion 48 may be formed by stacking up a resin on the upper surface of a plate-like substrate.

Next, as shown in FIG. 6B, a resin including the first phosphor particles 45 is filled in the concave portion 47 and is further stacked above the concave portion 47, thereby forming the first sealing resin 43 which seals the first light-emitting elements 41.

Next, as shown in FIG. 6C, a resin including the second phosphor particles 46 is filled in a region surrounded by the first sealing resin 43 using the first sealing resin 43 as a dam and is then cured, thereby forming the second sealing resin 44 which seals the second light-emitting element 42. Here, the resin of the second sealing resin 44 is filled after the first sealing resin 43 is cured to the extent that the first sealing resin 43 is not mixed with the resin of the second sealing resin 44.

Fifth Embodiment

The fifth embodiment is different from the fourth embodiment in that the substrate includes plural convex portions each mounting the light-emitting elements. It should be noted that the explanation of the same features as the fourth embodiment will be omitted or simplified.

Structure of Light-Emitting Device

Figure 7A:
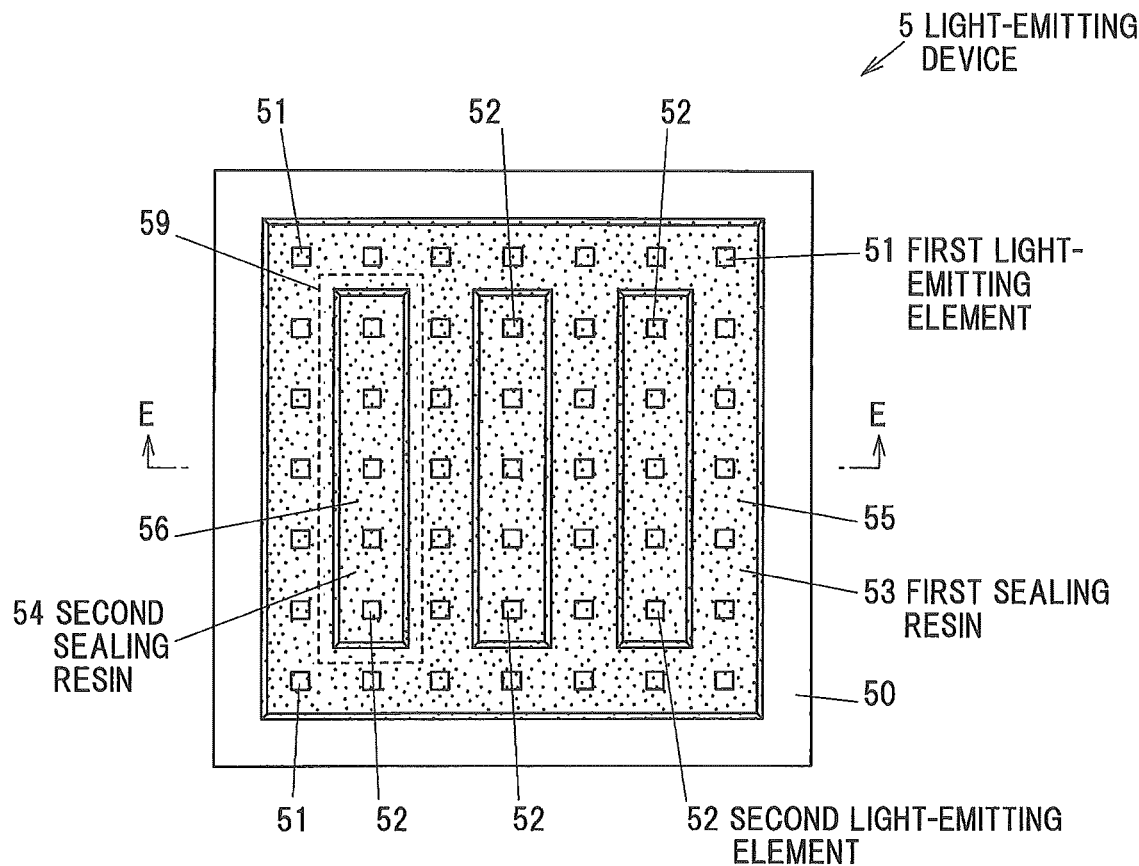
FIG. 7A is a top view showing a light-emitting device in a fifth embodiment.
Figure 7B:
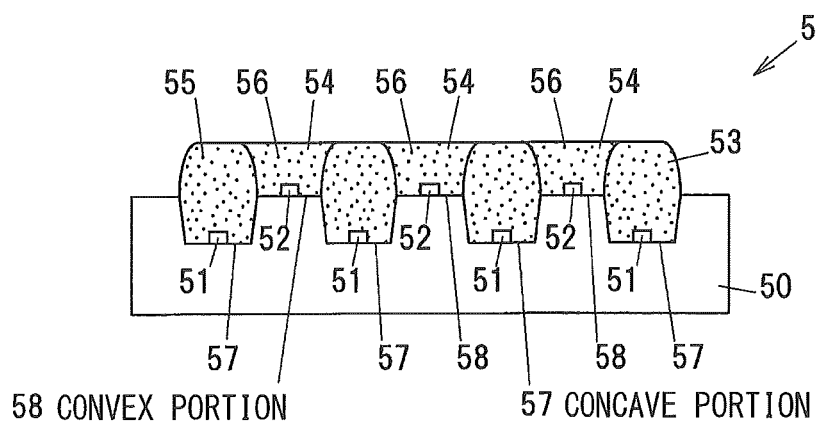
FIG. 7B is a vertical cross-sectional view showing the light-emitting device taken on line E-E of FIG. 7A.

FIG. 7A is a top view showing a light-emitting device 5 in the fifth embodiment. FIG. 7B is a vertical cross-sectional view showing the light-emitting device 5 taken on line E-E of FIG. 7A.

The light-emitting device 5 has a substrate 50 having a concave portion 57 and convex portions 58 on the upper surface thereof, first light-emitting elements 51 placed on the bottom surface of the concave portion 57, a convex-shaped first sealing resin 53 which has annular portions 59 each having a closed annular shape in a top view and is provided in the concave portion 57 as well as above the concave portion 57 to seal the first light-emitting elements 51, second light-emitting elements 52 arranged on the upper surfaces of the convex portions 58 surrounded by the annular portions 59 of the first sealing resin 53, and second sealing resins 54 filled in regions surrounded by the annular portions 59 to seal the second light-emitting elements 52.

A dotted line shown in FIG. 7A conceptually shows one of positions of the annular portions 59 of the first sealing resin 53. In the example shown in FIG. 7A, three annular portions 59 each surrounding one convex portion 58 are included in the first sealing resin 53. The second light-emitting elements 52 are placed on the three convex portions 58 surrounded by the annular portions 59.

Either the first sealing resin 53 or the second sealing resin 54 includes phosphor particles, or the first sealing resin 53 and the second sealing resin 54 respectively include phosphor particles emitting different fluorescent colors. In the example shown in FIGS. 7A and 7B, the first sealing resin 53 and the second sealing resin 54 respectively include first phosphor particles 55 and second phosphor particles 56.

The substrate 50 is, e.g., a circuit board or a lead frame inserted board.

The first light-emitting element 51 and the second light-emitting element 52 are the same light-emitting elements as the first light-emitting element 11 and the second light-emitting element 12 in the first embodiment.

Since the first light-emitting elements 51 are placed at the lower position than the second light-emitting elements 52, the amount of light emitted from the first light-emitting elements 51 toward the second light-emitting elements 52 is larger than the amount of light emitted from the second light-emitting elements 52 toward the first light-emitting elements 51. Therefore, an emission wavelength of the first light-emitting element 51 is preferably longer than that of the second light-emitting element 52 in order to suppress absorption of light from the first light-emitting elements 51 by the second light-emitting elements 52.

The first sealing resin 53 and the second sealing resin 54 are respectively formed of the same resins as the first sealing resin 13 and the second sealing resin 14 in the first embodiment.

Since the first sealing resin 53 is formed by stacking a resin above the concave portions 57, thixotropy of the before curing is preferably high. When thixotropy is high, an increase in viscosity after formation is large and the shape thereof is thus likely to be kept until the resin is cured.

On the other hand, the second sealing resin 54 is formed by filling a region surrounded by the annular portion 59 of the first sealing resin 53 with a resin using the annular portion 59 as a dam and then curing the resin. Accordingly, if the resin has high thixotropy before curing, it is difficult to appropriately fill the resin.

Therefore, the resin as a material of the first sealing resin 53 preferably has higher thixotropy before curing than the resin as a material of the second sealing resin 54.

Since the second sealing resins 54 are formed after the first sealing resin 53 is completely or substantially cured, the first sealing resin 53 and the second sealing resins 54 are not mixed with each other. In other words, phosphor particles included in each of the first sealing resin 53 and the second sealing resins 54 do not move into the other sealing resin.

Sixth Embodiment

The sixth embodiment is different from the fifth embodiment in a pattern of the concave and convex portions on the substrate. It should be noted that the explanation of the same features as the fifth embodiment will be omitted or simplified.

Structure of Light-Emitting Device

Figure 8A:
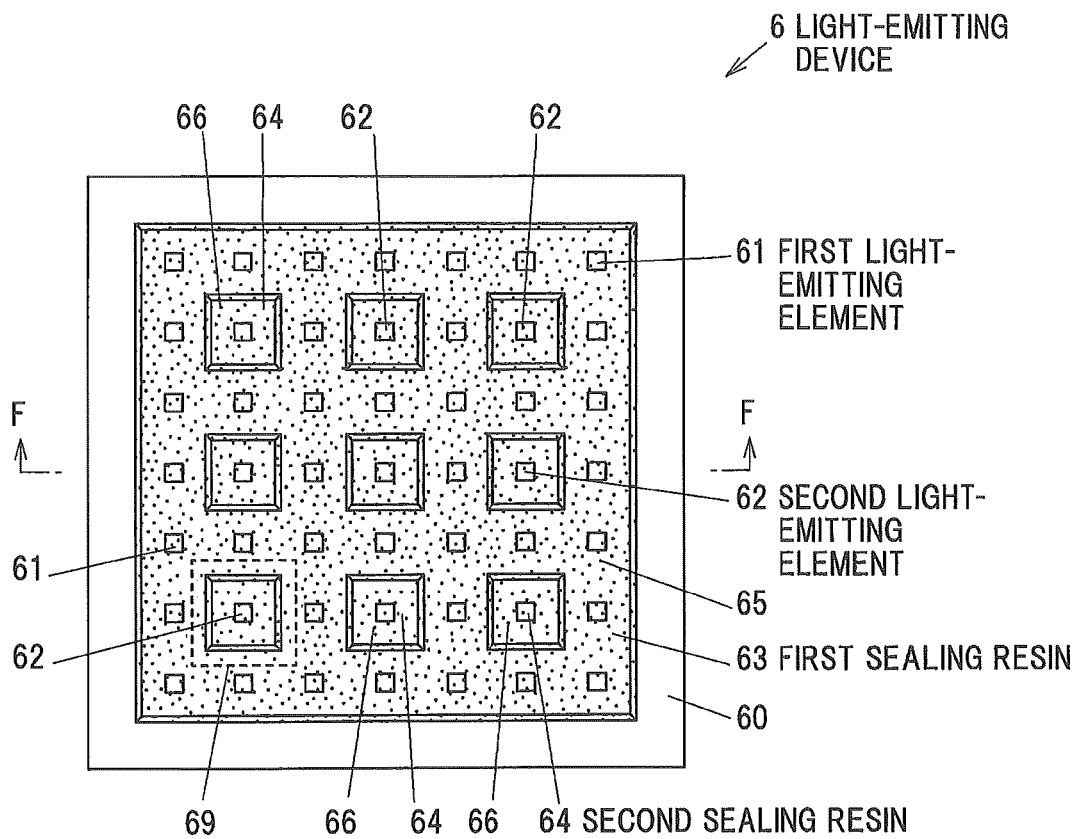
FIG. 8A is a top view showing a light-emitting device in a sixth embodiment.
Figure 8B:
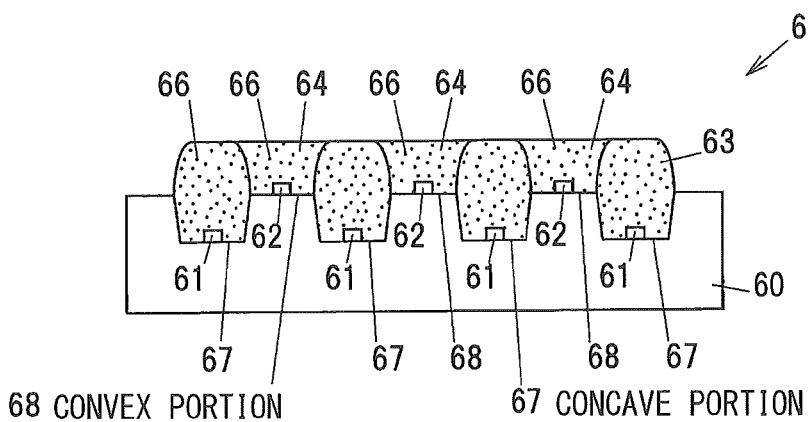
FIG. 8B is a vertical cross-sectional view showing the light-emitting device taken on line F-F of FIG. 8A.

FIG. 8A is a top view showing a light-emitting device 6 in the sixth embodiment. FIG. 8B is a vertical cross-sectional view showing the light-emitting device 6 taken on line F-F of FIG. 8A.

The light-emitting device 6 has a substrate 60 having a concave portion 67 and convex portions 68 on the upper surface thereof, first light-emitting elements 61 placed on the bottom surface of the concave portion 67, a convex-shaped first sealing resin 63 which has annular portions 69 each having a closed annular shape in a top view and is provided in the concave portion 67 as well as above the concave portion 67 to seal the first light-emitting elements 61, second light-emitting elements 62 arranged on the upper surfaces of the convex portions 68 surrounded by the annular portions 69 of the first sealing resin 63, and second sealing resins 64 filled in regions surrounded by the annular portions 69 to seal the second light-emitting elements 62.

A dotted line shown in FIG. 8A conceptually shows one of positions of the annular portions 69 of the first sealing resin 63. In the example shown in FIG. 8A, the first sealing resin 63 has a lattice-like shape in a plan view and the second light-emitting element 62 is placed on each of the convex portions 68 located in squares of the lattice.

Either the first sealing resin 63 or the second sealing resin 64 includes phosphor particles, or the first sealing resin 63 and the second sealing resin 64 respectively include phosphor particles emitting different fluorescent colors. In the example shown in FIGS. 8A and 8B, the first sealing resin 63 and the second sealing resin 64 respectively include first phosphor particles 65 and second phosphor particles 66.

The substrate 60 is, e.g., a circuit board or a lead frame inserted board.

The first light-emitting element 61 and the second light-emitting element 62 are the same light-emitting elements as the first light-emitting element 11 and the second light-emitting element 12 in the first embodiment.

Since the first light-emitting elements 61 are placed at the lower position than the second light-emitting elements 62, the amount of light emitted from the first light-emitting elements 61 toward the second light-emitting elements 62 is larger than the amount of light emitted from the second light-emitting elements 62 toward the first light-emitting elements 61. Therefore, an emission wavelength of the first light-emitting element 61 is preferably longer than that of the second light-emitting element 62 in order to suppress absorption of light from the first light-emitting elements 61 by the second light-emitting elements 62.

The first sealing resin 63 and the second sealing resin 64 are respectively formed of the same resins as the first sealing resin 13 and the second sealing resin 14 in the first embodiment. The resin as a material of the first sealing resin 63 preferably has higher thixotropy before curing than the resin as a material of the second sealing resin 64.

Since the second sealing resins 64 are formed after the first sealing resin 63 is completely or substantially cured, the first sealing resin 63 and the second sealing resins 64 are not mixed with each other. In other words, phosphor particles included in each of the first sealing resin 63 and the second sealing resins 64 do not move into the other sealing resin.

Effects of the Embodiments

In the first to sixth embodiments, a dam for preventing a resin from flowing out is not present at boundaries between plural light-emitting portions each of which is composed of a light-emitting element and phosphor particles included in a sealing resin and emits a different color, and this allows area saving of the light-emitting device. In addition, since a dam is not formed at the boundaries between plural light-emitting portions emitting different colors, it is possible to simplify a manufacturing process of a light-emitting device provided with plural light-emitting portions emitting different colors as compared to the conventional art.

Although the embodiments of the invention have been described above, the invention is not intended to be limited to the embodiments and the various kinds of modifications can be implemented without departing from the gist of the invention. In addition, the constituent elements in the embodiments can be arbitrarily combined without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. A light-emitting device, comprising:
a first light-emitting element disposed on a substrate;
a convex-shaped first sealing resin that comprises an annular portion formed in a closed annular shape in a top view and seals the first light-emitting element;
a second light-emitting element disposed on the substrate in a region surrounded by the annular portion of the first sealing resin; and
a second sealing resin filled in the region surrounded by the annular portion so as to seal the second light-emitting element,
wherein one of the first and second sealing resin includes a phosphor particle or the first and second sealing resins include a phosphor particle to emit a different fluorescent color from each other, and
wherein a resin material of the first sealing resin has a higher thixotropy before curing than a resin material of the second sealing resin.

2. A light-emitting device, comprising:
a first light-emitting element disposed on a substrate;
a convex-shaped first sealing resin that comprises an annular portion formed in a closed annular shape in a top view and seals the first light-emitting element;
a second light-emitting element disposed on the substrate in a region surrounded by the annular portion of the first sealing resin; and
a second sealing resin filled in the region surrounded by the annular portion so as to seal the second light-emitting element,
wherein one of the first and second sealing resins includes a phosphor particle or the first and second sealing resins include a phosphor particle to emit a different fluorescent color from each other,
wherein the substrate comprises a concave portion and a convex portion on an upper surface thereof,
wherein the first light-emitting element is disposed on a bottom surface of the concave portion,
wherein the first sealing resin is provided in the concave portion and above the concave portion, and
wherein the second light-emitting element is disposed on an upper surface of the convex portion.

3. The light-emitting device according to claim 2, wherein an emission wavelength of the first light-emitting element is longer than that of the second light-emitting element.

4. The light-emitting device according to claim 1, wherein the second sealing resin is disposed between inner edges of the annular portion.

5. The light-emitting device according to claim 1, wherein the convex-shaped first sealing resin seals only the first light-emitting element, and wherein the second sealing resin seals only the second light-emitting element.

6. The light-emitting device according to claim 1, wherein the second sealing resin contacts the second light-emitting element.

7. The light-emitting device according to claim 1, wherein an upper edge of the first sealing resin and an upper edge of the second sealing resin are co-planar.

8. The light-emitting device according to claim 1, wherein an inner edge of the annular portion of the first sealing resin contacts an outer edge of the second sealing resin.

9. The light-emitting device according to claim 1, wherein an upper edge of the first sealing resin is exposed.

10. The light-emitting device according to claim 1, wherein the first sealing resin is exposed.

11. The light-emitting device according to claim 1, wherein the first sealing resin contacts the first light-emitting element, and
wherein the second sealing resin contacts the second light-emitting element.

12. A light-emitting device, comprising;
a first light-emitting element disposed on a substrate;
a convex-shaped first sealing resin that comprises an annular portion formed in a closed annular shape in a top view, wherein the first sealing resin seals and contacts the first light-emitting element;
a second light-emitting element disposed on the substrate in a region surrounded by the annular portion of the first sealing resin; and
a second sealing resin filled in the region surrounded by the annular portion so as to seal and contact the second light-emitting element,
wherein at least one of the first and the second sealing resins includes a phosphor particle to emit a different fluorescent color from each other, and
wherein a resin material of the first sealing resin has a higher thixotropy before curing than a resin material of the second sealing resin.

\* \* \* \* \*